United States Patent
Ko et al.

(10) Patent No.: US 8,012,789 B2
(45) Date of Patent: Sep. 6, 2011

(54) NONVOLATILE MEMORY DEVICE AND METHOD OF MANUFACTURING THE SAME

(75) Inventors: Han-Bong Ko, Hwaseong-si (KR); Yong-Ho Ha, Hwasung-si (KR); Doo-Hwan Park, Seoul (KR); Bong-Jin Kuh, Suwon-si (KR); Hee-Ju Shin, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 214 days.

(21) Appl. No.: 12/379,277

(22) Filed: Feb. 18, 2009

(65) Prior Publication Data
US 2009/0206318 A1 Aug. 20, 2009

(30) Foreign Application Priority Data
Feb. 19, 2008 (KR) .......... 10-2008-0014940

(51) Int. Cl.
*H01L 21/00* (2006.01)
(52) U.S. Cl. .......... 438/95; 438/676; 257/E21.169; 257/E21.622

(58) Field of Classification Search .......... 438/95, 438/676; 257/E21.169, E21.622
See application file for complete search history.

(56) References Cited

U.S. PATENT DOCUMENTS
| | | | |
|---|---|---|---|
| 5,489,367 A * | 2/1996 | Kubota et al. | 204/192.15 |
| 7,233,054 B1 | 6/2007 | Anh et al. | |
| 7,456,420 B2 * | 11/2008 | Cote et al. | 257/4 |
| 2008/0164452 A1 * | 7/2008 | Joseph et al. | 257/3 |

FOREIGN PATENT DOCUMENTS
| | | |
|---|---|---|
| JP | 2007-243180 A | 9/2007 |
| KR | 10-2007-0063808 A | 6/2007 |

* cited by examiner

*Primary Examiner* — Quoc D Hoang
(74) *Attorney, Agent, or Firm* — Lee & Morse, P.C.

(57) ABSTRACT

A nonvolatile memory device, including a lower electrode on a semiconductor substrate, a phase change material pattern on the lower electrode, an adhesion pattern on the phase change material pattern and an upper electrode on the adhesion pattern, wherein the adhesion pattern includes a conductor including nitrogen.

13 Claims, 14 Drawing Sheets

NONVOLATILE MEMORY DEVICE AND METHOD OF MANUFACTURING THE SAME

BACKGROUND

1. Technical Field

Embodiments relate to a nonvolatile memory device and a method of manufacturing the same.

2. Description of the Related Art

Nonvolatile memory devices include semiconductor memory devices that maintain stored data even when the power supply is interrupted. Phase-change random access memory (PRAM) can store data according to a resistance state of a phase-change material pattern. A memory cell storing binary data of a PRAM may include a switching device, a lower electrode, a phase change material pattern, and an upper electrode. The switching device may be formed on a semiconductor substrate and the lower electrode, the phase change material pattern, and the upper electrode may be formed on the switching device. Chalcogenide of GeSeTe (GST) system may be used as the phase change material pattern. The lower electrode may heat the phase change material pattern. A portion of the phase change material pattern, or all of the phase change material pattern, may be converted from a crystalline state to an amorphous state, or from an amorphous state to a crystalline state. This conversion depends on the degree of heating of the phase change material pattern by the lower electrode, and a resistive value of the phase change material pattern.

Specifically, a PRAM may apply a set pulse and a reset pulse to store binary data. The set pulse is needed to convert the phase change material pattern to a crystalline state. The set pulse applies a temperature higher than a temperature required to change the phase change material pattern to a crystalline state to the phase change material pattern for several nanoseconds through the lower electrode.

The reset pulse is needed to convert the phase change material pattern to an amorphous state. The reset pulse applies a temperature higher than a temperature required to change the phase change material pattern to the amorphous state to the phase change material pattern for several tens of nanoseconds through the lower electrode.

Conventionally, a temperature of the phase change material pattern affected by the reset pulse is higher than a temperature of the phase change material pattern affected by the set pulse. Since temperature rise is effected by Joule heating caused by an electrical current, the current flowing through the phase change material pattern when the set pulse is applied is smaller (for a corresponding lower temperature) than a current flowing through the phase change material pattern when the reset pulse is applied (when the temperature should be higher).

Binary data may be stored and read depending on a resistance state of the phase change material pattern. The amorphous state material may have a resistivity higher than that of the crystalline state material, and thus the phase change material pattern may have a higher resistance for a given pattern size and shape when the material is in the amorphous state. The crystalline state is referred to as a set state and the amorphous state is referred to as a reset state.

When reading data, the reading operation can maintain a high speed when a resistance (hereinafter, referred to as a set resistance) of the phase change material pattern in the crystalline state (i.e., the set state) is small. When storing data, the storing operation can maintain a high speed when a reset current for changing the phase change material pattern to an amorphous state (i.e., the reset state) is small. Thus, in a PRAM, a reset current should be reduced for a fast memory operation and a set resistance should be reduced for a fast writing operation.

A phase change material pattern used in a PRAM is mainly material of GST system. When a voltage is applied to the phase change layer, the phase change layer shows a negative resistance characteristics and a resistance of the phase change material pattern is abruptly reduced. A PRAM is a memory device for storing binary data. A PRAM easily discriminates binary data because a ratio of a resistance according to a state of a binary data. A PRAM may not require a high voltage.

SUMMARY

Embodiments are therefore directed to a nonvolatile memory device and a method of manufacturing the same, which substantially overcome one or more of the problems due to the limitations and disadvantages of the prior art.

It is therefore a feature of an embodiment to provide a nonvolatile memory device including an adhesion pattern material that prevents lifting.

It is therefore another feature of an embodiment to provide a nonvolatile memory device having a lower reset current for a fast memory operation.

It is therefore another feature of an embodiment to provide a nonvolatile memory device having a lower set resistance for a fast reading operation.

At least one of the above and other features and advantages may be realized by providing a nonvolatile memory device, including a lower electrode on a semiconductor substrate, a phase change material pattern on the lower electrode, an adhesion pattern on the phase change material pattern, and an upper electrode on the adhesion pattern, wherein the adhesion pattern includes a conductor including nitrogen.

The adhesion pattern and the upper electrode may each independently include a metal nitride layer or a metal oxynitride layer, and a ratio of metal to nitrogen in the metal nitride or oxynitride layer in the adhesion pattern may be different from a ratio of metal to nitrogen in the metal nitride or oxynitride layer in the upper electrode.

The adhesion pattern may include a metal nitride layer, and a ratio of metal to nitrogen in the metal nitride layer may be about 1:0.95 to about 1:1.03.

The metal of the metal nitride layer may include at least one of titanium, tantalum, molybdenum, and tungsten.

The upper electrode may include at least one of metal, metal nitride, and metal oxynitride.

The upper electrode may include a metal including at least one of Ti, Ta, Mo, W, TiW, TiSi, and TaSi.

The upper electrode may include a metal nitride including at least one of TiN, TaN, WN, MoN, NbN, TiSiN, TiAlN, ZrSiN, WSiN, WBN, ZrAlN, MoSiN, TaSiN, and TaAlN.

The upper electrode may include a metal oxynitride including at least one of TiON, TiAlON, WON, and TaON.

The phase change material pattern may include at least one of Ge—Sb—Te, Sb—Te, As—Sb—Te, and Sb—Se.

The phase change material pattern may further include at least one metal.

The lower electrode may include at least one of metal nitride, metal, metal oxynitride, silicide, and conductive carbon.

The lower electrode may include at least one of Ti, Ta, Mo, W, TiN, TaN, WN, MoN, NbN, TiSiN, TiAlN, ZrSiN, WSiN, WBN, ZrAlN, MoSiN, TaSiN, TaAlN, TiW, TiSi, TaSi, TiON, TiAlON, WON, and TaON.

At least one of the above and other features and advantages may also be realized by providing a method of manufacturing a nonvolatile memory device, including forming a lower electrode on a semiconductor substrate, forming a phase change material pattern on the lower electrode, forming an adhesion pattern on the phase change material pattern, and forming an upper electrode on the adhesion pattern, wherein the adhesion pattern includes a conductor including nitrogen.

The adhesion pattern and the upper electrode may each independently include a metal nitride layer or a metal oxynitride layer, and a ratio of metal to nitrogen in the metal nitride or oxynitride layer in the adhesion pattern may be different from a ratio of metal to nitrogen in the metal nitride or oxynitride layer in the upper electrode.

The adhesion pattern and the upper electrode may be formed in a sputtering device using argon and nitrogen plasma on a metal target, and the adhesion pattern may include a metal nitride layer formed under a partial pressure of nitrogen that results in a total pressure in the sputtering device, measured as the partial pressure of nitrogen increases, being different than a total pressure in the sputtering device under the same partial pressure of nitrogen, measured as the partial pressure of nitrogen decreases.

The adhesion pattern may include a metal nitride layer, and a ratio of metal to nitrogen in the metal nitride layer may be about 1:0.95 to about 1:1.03.

The metal of the metal nitride layer may include at least one of titanium, tantalum, molybdenum, and tungsten.

The upper electrode may include at least one of metal, metal nitride, and metal oxynitride.

The upper electrode may include a metal including at least one of Ti, Ta, Mo, W, TiW, TiSi, and TaSi.

The upper electrode may include a metal nitride including at least one of TiN, TaN, WN, MoN, NbN, TiSiN, TiAlN, ZrSiN, WSiN, WBN, ZrAlN, MoSiN, TaSiN, and TaAlN.

The upper electrode may include a metal oxynitride including at least one of TiON, TiAlON, WON, and TaON.

The phase change material pattern may include at least one of Ge—Sb—Te, Sb—Te, As—Sb—Te, and Sb—Se.

The phase change material pattern may further include at least one metal layer.

The lower electrode may include at least one of metal nitride, metal, metal oxynitride, silicide, and conductive carbon.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
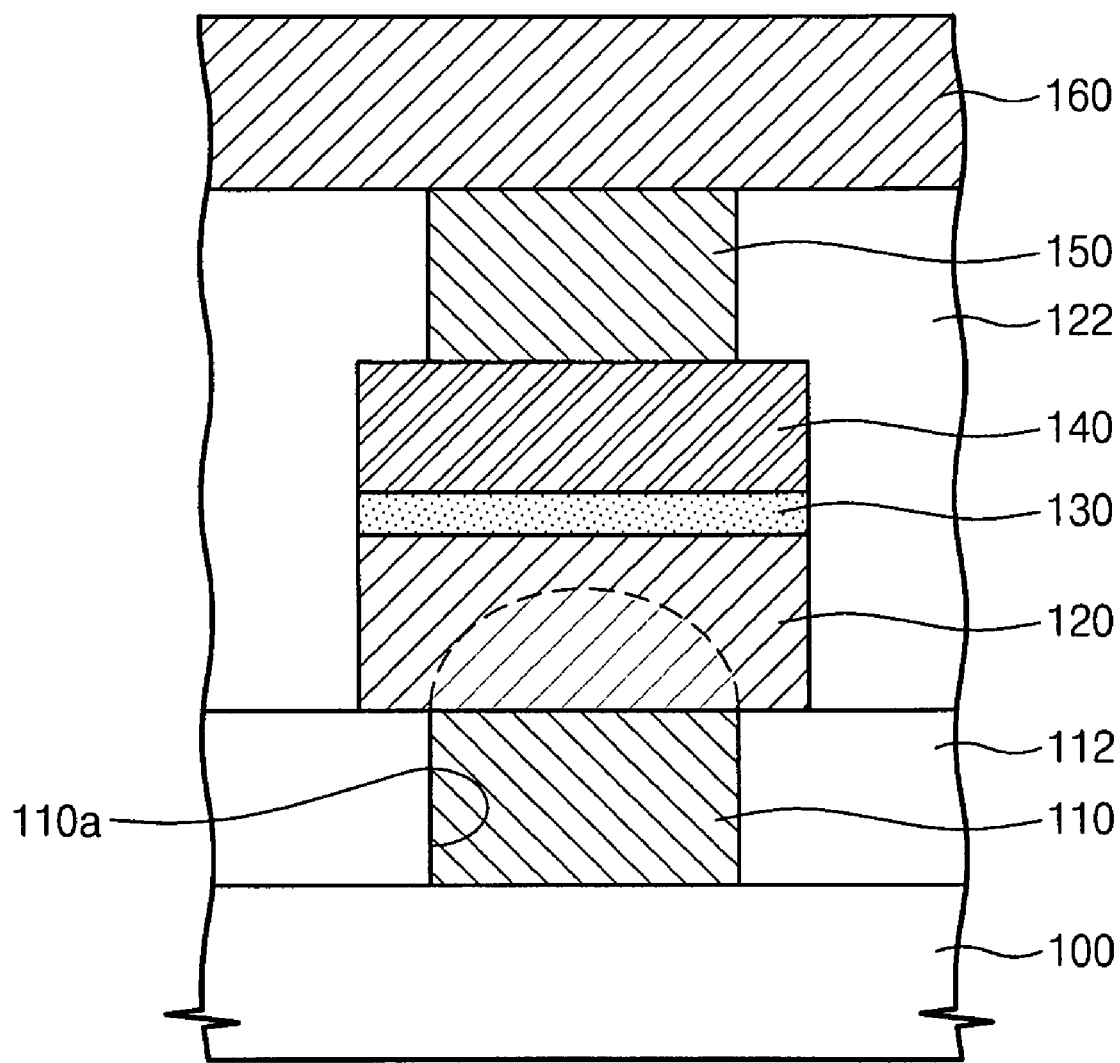
FIG. 1 illustrates a cross-sectional view of a nonvolatile memory device according to an embodiment.

Korean Patent Application No. 10-2008-0014940, filed on Feb. 19, 2008, in the Korean Intellectual Property Office, and entitled: "Nonvolatile Memory Devices and Methods of Forming the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a metal nitride" may represent a single compound, e.g., titanium nitride, or multiple compounds in combination, e.g., titanium nitride mixed with tungsten nitride.

It will be understood that when an element is referred to as being "connected" or "coupled" to another element, it may be directly connected or coupled to the other element, or intervening elements may be present. When an element is referred to as being "directly connected" or "directly coupled" to another element, there may be no intervening elements present.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting. It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a cross-sectional view of a nonvolatile memory device according to an embodiment. Referring to FIG. 1, a lower insulating layer 112 may be disposed on a semiconductor substrate 100 of a nonvolatile memory device. The lower insulating layer 112 may include, e.g., a silicon oxide layer. A lower electrode 110 may be disposed in a first contact hole 110a that penetrates the lower insulating layer 112. A phase change material pattern 120 and an upper electrode 140 may be sequentially stacked on the lower electrode 110. The phase change material pattern 120 and the upper electrode 140 may have an aligned sidewall. The upper electrode 140 may be connected to a bit line 160 through a bit line contact plug 150. An upper insulating layer may be disposed between the lower insulating layer 112 and the bit line 160.

An adhesion pattern 130 may be disposed between the phase change material pattern 120 and the upper electrode 140. The adhesion pattern 130 may advantageously improve adhesion between the upper electrode 140 and the phase change material pattern 120.

The lower electrode 110 may be in contact with at least a portion of a bottom surface of the phase change material pattern 120. A bottom surface of the lower electrode 110 may be electrically connected to source/drain regions in the semiconductor substrate 100. The lower electrode 110 may include a material in which resistivity increases in proportion to a rise in temperature, and may heat a region in contact with the phase change material pattern 120.

Titanium may be included in the adhesion pattern 130 to advantageously increase adhesion between the upper electrode 140 and the phase change material pattern 120. The titanium, however, may diffuse into the phase change material pattern 120. The diffusion of titanium into the phase change material pattern 120 may cause a reset current of the phase change material pattern 120 to undesirably increase. Such an increase in the reset current may be detrimental to data write speeds, i.e., may slow down data writing.

If the thickness of the titanium is decreased, or the titanium is removed, an undesirable lifting phenomenon may occur, due to a reduction in adhesion in the interface between the phase change material pattern 120 and the upper electrode 140. Further, if a thickness of the titanium is decreased or the titanium is removed, the reset current may also undesirably increase due to parasitic resistance between the phase change material pattern 120 and the upper electrode 140.

To overcome problems of the lifting and/or the increase of the reset current, a material which will be used as a new adhesion pattern is needed. If resistances of the adhesion pattern 130 and the upper electrode 140 are small, the set resistance may be reduced, thereby beneficially increasing the speed of a reading operation. Thus, resistivities of the adhesion pattern 130 and the upper electrode 140 should be decreased in order to advantageously reduce the set resistance.

Specifically, the adhesive pattern 130 and the upper electrode 140 may include, e.g., a metal nitride layer or a metal oxynitride layer. The ratio of metal to nitrogen in the metal nitride layer or the metal oxynitride layer may be lower in the adhesion pattern 130 than in the upper electrode 140. As a result, a reset current of a PRAM may be beneficially reduced by more than about 50%, compared with a conventional PRAM. For example, the adhesion pattern 130 may include a metal nitride layer including metal and nitrogen. The ratio of metal to nitrogen in the metal nitride layer may be about 1:0.95 to about 1:1.03. The metal of the metal nitride layer of the adhesion pattern 130 may include at least one of titanium, tantalum, molybdenum, and tungsten.

The upper electrode 140 may include at least one of a metal layer, a metal nitride layer, and a metal oxynitride layer. Where the upper electrode 140 includes a metal layer, the metal layer may include at least one of, e.g., Ti, Ta, Mo, W, TiW, TiSi, and TaSi. Where the upper electrode 140 includes the metal nitride layer, the metal nitride layer may include at least one of, e.g., TiN, TaN, WN, MoN, NbN, TiSiN, TiAlN, ZrSiN, WSiN, WBN, ZrAlN, MoSiN, TaSiN, and TaAlN. Where the upper electrode 140 includes the metal oxynitride layer, the metal oxynitride layer may include at least one of, e.g., TiON, TiAlON, WON, and TaON.

The phase change material pattern 120 may include at least one of Ge—Sb—Te, Sb—Te, As—Sb—Te, and Sb—Se. In an implementation, the phase change material pattern 120 may include $Ge_2SbTe_5$ as the Ge—Sb—Te material. In implementation, the phase change material pattern 120 may include at least one of an As—Sb-metal compound, an As—Ge—Te-metal compound, a metal-Sb—Te-metal compound, a 5A group element-Sb—Te-metal compound, a 6A group element-Sb—Te-metal compound, a 5A group element-Sb—Se-metal compound, and a 6A group element-Sb—Se-metal compound. The 5A group element may include, e.g., nitrogen (N) or phosphorus (P), and the 6A group element may include, e.g., oxygen (O) or sulfur (S). A composition ratio of the compounds may vary.

The lower electrode 110 may serve to heat the phase change material pattern 120. The lower electrode 110 may include at least one of metal, metal nitride, metal oxynitride, silicide, and conductive carbon. Where lower electrode 110 includes metal, the metal may include at least one of, e.g., Ti, Ta, Mo, W, TiW, TiSi, and TaSi. Where the lower electrode 110 includes metal nitride, the metal nitride may include at least one of, e.g., TiN, TaN, WN, MoN, NbN, TiSiN, TiAlN, ZrSiN, WSiN, WBN, ZrAlN, MoSiN, TaSiN, and TaAlN. Where the lower electrode 110 includes metal oxynitride, the metal oxynitride may include at least one of, e.g., TiON, TiAlON, WON, and TaON.

The diameter of the lower electrode may be smaller than that of the phase change material pattern 120. The lower diameter of the lower electrode 110 may decrease a cross-section of a resistance, thereby increasing resistive value. Thus, when the resistivity is high, the temperature may be greatly increased with a low power. The ability to achieve a high temperature with low power, i.e., low current, may help enable faster data write speeds by decreasing the reset current.

The semiconductor substrate 100 may include a lower structure (not shown). The lower structure may include, e.g., a diode or transistor. The semiconductor substrate 100 may include at least one of a silicon substrate, a germanium substrate, and a SOI substrate.

The lower insulating layer 112 and the upper insulating layer 122 may include at least one of a silicon oxide layer, a silicon oxynitride layer, and a silicon nitride layer. The lower insulating layer 112 may include an impurity. The lower insulating layer 112 may be formed using at least one of a chemical vapor deposition (CVD) method, a spin coating method, and a plasma chemical vapor deposition (PCVD) method. A top surface of the lower insulating layer 112 and/or a top surface of the upper insulating layer 122 may be planarized. The lower insulating layer 112 and the upper insulating layer 122 may have a multilayer structure. Thus, each of the layers may include a different material.

Figure 2:
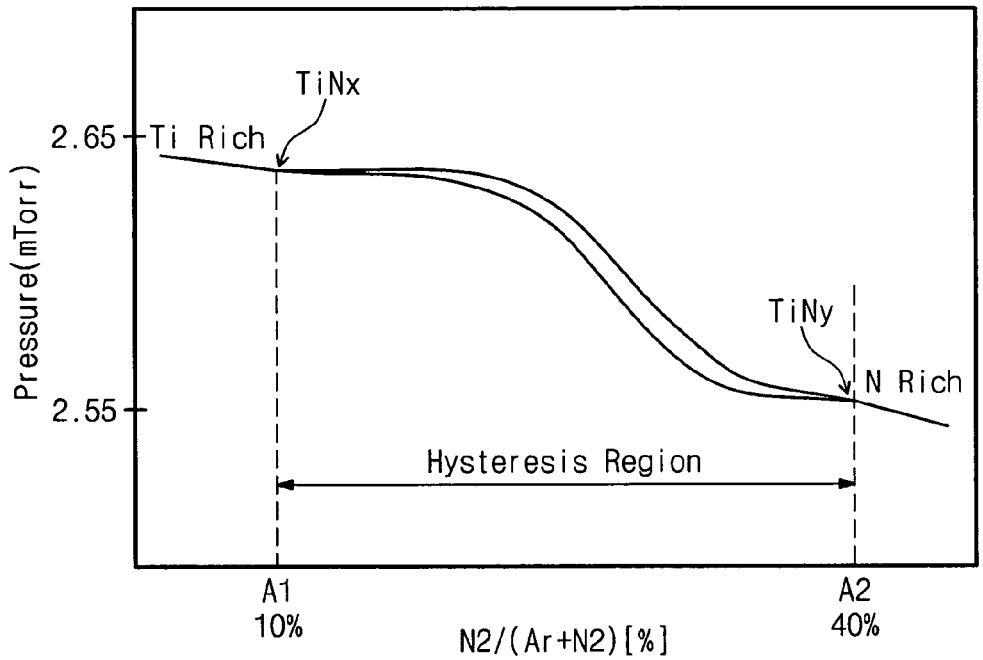
FIG. 2 illustrates a graph of a generic curve of a sputter device forming an adhesion pattern according to an embodiment.

FIG. 2 illustrates a graph of a curve in a sputter device forming an adhesion pattern according to an embodiment. Referring to FIG. 2, the graph represents a change of pressure of the sputtering device according to a ratio of argon (Ar) to nitrogen ($N_2$), when the target of the sputter device is titanium (Ti) and the total gas flow rate is fixed. The pumping speed of the sputter device may be uniform.

As shown in FIG. 2, if the partial pressure of nitrogen is increased relative to argon, a pressure of the sputtering device is reduced, because titanium of the sputter target combines with nitrogen to increase the amount of titanium nitride formed.

Referring to FIG. 2, a region may exist where the pressure of the sputtering device, measured while increasing the partial pressure of nitrogen, is different from the pressure of the sputtering device, measured while decreasing the partial pressure of nitrogen. The region in which the measured pressures are different is referred to as a hysteresis region. At the upper and lower bounds of the hysteresis region, the boundary where the pressures divides when the partial pressure of nitrogen is low is a first region (A1), and the boundary where the measured pressure divides when the partial pressure of nitrogen is high is a second region (A2).

When the partial pressure of nitrogen is less than A1, the material deposited on the semiconductor substrate 100 is TiN, rich in Ti, i.e., including abundant Ti. When the partial pressure of nitrogen is greater than A2, the material deposited on the semiconductor substrate 100 is TiN rich in N, i.e., including abundant N. When the partial pressure of nitrogen equals A1, the material deposited on the semiconductor substrate 100 is $TiN_x$, and when the partial pressure of nitrogen equals A2, the material deposited on the semiconductor substrate 100 is $TiN_y$.

When the partial pressure of nitrogen is in the region between A1 and A2, the material deposited on the semiconductor substrate 100 is $TiN_z$. Here, x may be smaller than y. Also, z may be about x to about y.

If the adhesion pattern 130 were to be formed of only titanium (Ti), an undesirable lifting phenomenon, where the adhesion pattern 130 is lifted, may occur during an annealing process performed after formation of the adhesion pattern 130. However, if the adhesion pattern 130 includes $TiN_y$, i.e., formed with a partial pressure of nitrogen at the A2 position, the lifting problem may be prevented. Moreover, if the adhesion pattern 130 is formed of $TiN_y$, an undesirable phenomenon where Ti diffuses into the phase change material pattern 120 may be considerably reduced, leading to high data write speeds. Moreover, in contrast to nitrogen-rich materials (i.e., TiN including abundant N formed by a partial pressure of nitrogen greater than A2) a resistivity of the $TiN_y$ may be lower than the resistivity of TiN including abundant N. Thus, as compared to a nitrogen-rich adhesion pattern 130 formed with a partial pressure of nitrogen greater than A2, the set resistance using an adhesion pattern 130 of $TiN_y$ may be reduced, enabling high data read speeds. The value "y" in $TiN_y$ may be $0.95 \leq y \leq 1.03$.

With respect to the upper electrode 140 formed on the adhesion pattern 130, forming TiN including abundant N is a simple process because a continuous process may be performed using the same equipment. TiN including abundant N used as the upper electrode 140 may include a material formed at a region exceeding the A2 position in FIG. 2.

As described above, the adhesion pattern 130 may be formed using a partial pressure of nitrogen corresponding to a point A2 at the upper bound of the hysteresis region. However, embodiments are not limited to a nitrogen partial pressure A2, For example, according to other embodiments, the adhesion pattern 130 may include $TiN_z$, formed using a partial pressure of nitrogen that is within the hysteresis region.

According to an embodiment, the adhesion pattern 130 may include $TiN_y$. The upper electrode 140 may include at least one of a metal layer, a metal nitride layer, and a metal oxynitride layer. Where the upper electrode 140 includes a metal layer, the metal layer may include at least one of, e.g., Ti, Ta, Mo, W, TiW, TiSi, and TaSi. Where the upper electrode 140 includes the metal nitride layer, the metal nitride layer may include at least one of, e.g., TiN, TaN, WN, MoN, NbN, TiSiN, TiAlN, ZrSiN, WSiN, WBN, ZrAlN, MoSiN, TaSiN, and TaAlN. Where the upper electrode 140 includes the metal oxynitride layer, the metal oxynitride layer may include at least one of, e.g., TiON, TiAlON, WON, and TaON.

According to an embodiment, the adhesion pattern 130 may include a different metal nitride or oxynitride layer. The upper electrode 140 formed on the adhesion pattern 130 may include a metal nitride layer and a metal oxynitride layer having a different composition ratio from that of the underlying adhesion pattern 130. For example, the nitrogen ratio, i.e., the fraction of nitrogen, in the adhesion pattern 130 may be less than that in the upper electrode 140.

Figure 3:
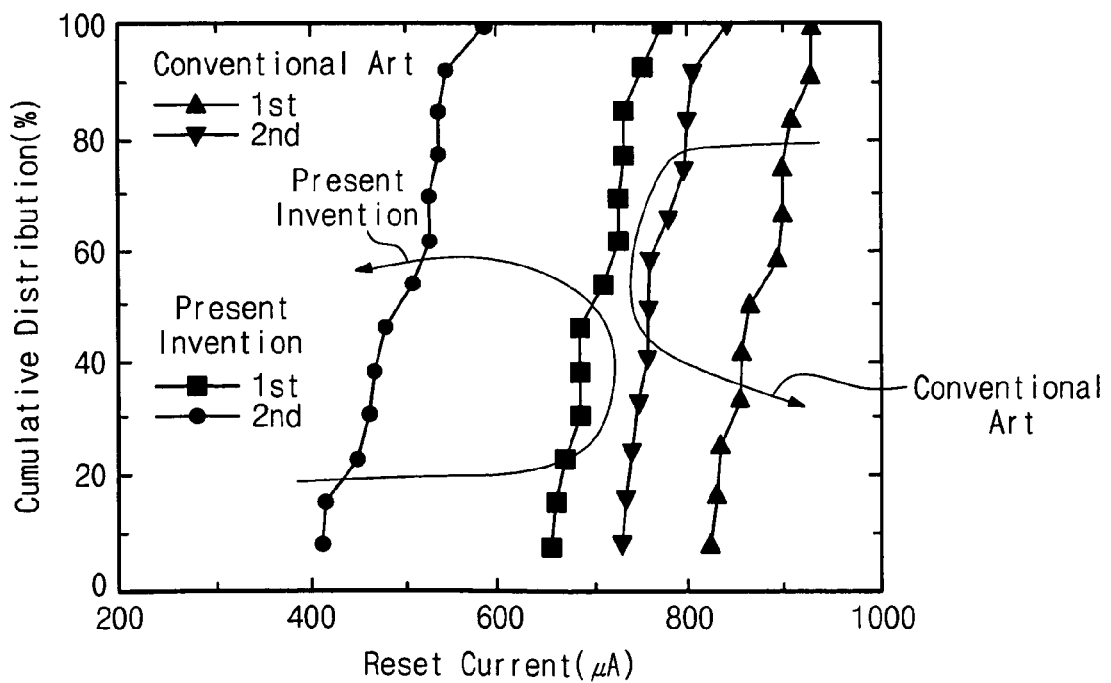
FIG. 3 illustrates a graph of the distribution of a reset current when using an adhesion pattern according to an embodiment.

FIG. 3 illustrates a graph of a cumulative distribution of the reset current when using an adhesion pattern according to an embodiment. Referring to FIG. 3, the graph shows a beneficial reduction of the reset current of about 50%, compared with the conventional art. The x axis represents a reset current and the y axis represents a cumulative distribution. The reset current may be different according to a first phase change and a second phase change. The reset current may saturate according to the number of phase change operations. According to an embodiment, in the case of a second phase change, the reset current may be desirably reduced by about 50% compared with a conventional adhesion pattern of Ti. The adhesion pattern 130 may include TiN$_y$ formed in the A2 region.

Figure 4:
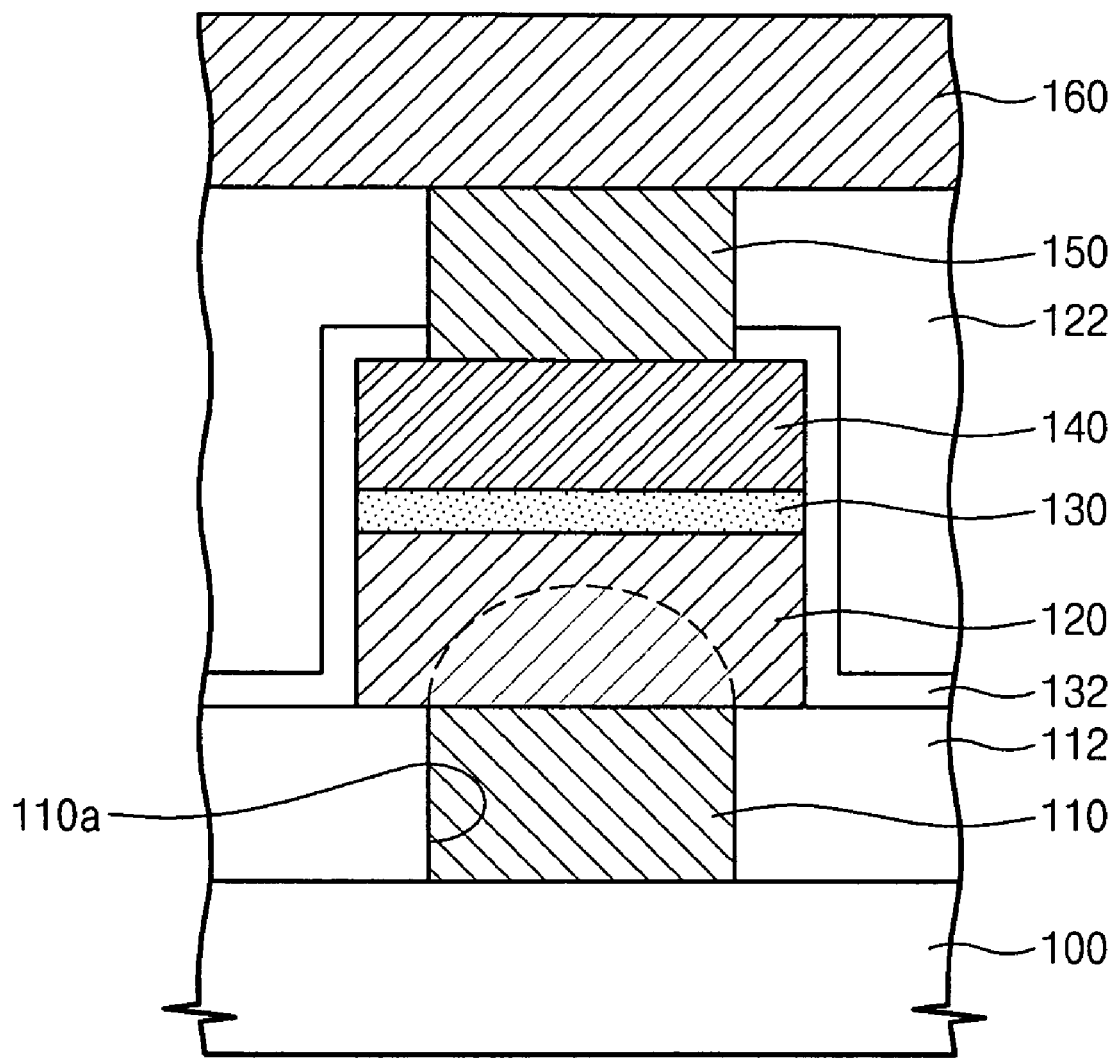
FIGS. 4 through 6 illustrate cross-sectional views of a nonvolatile memory device according to an embodiment.
Figure 5:
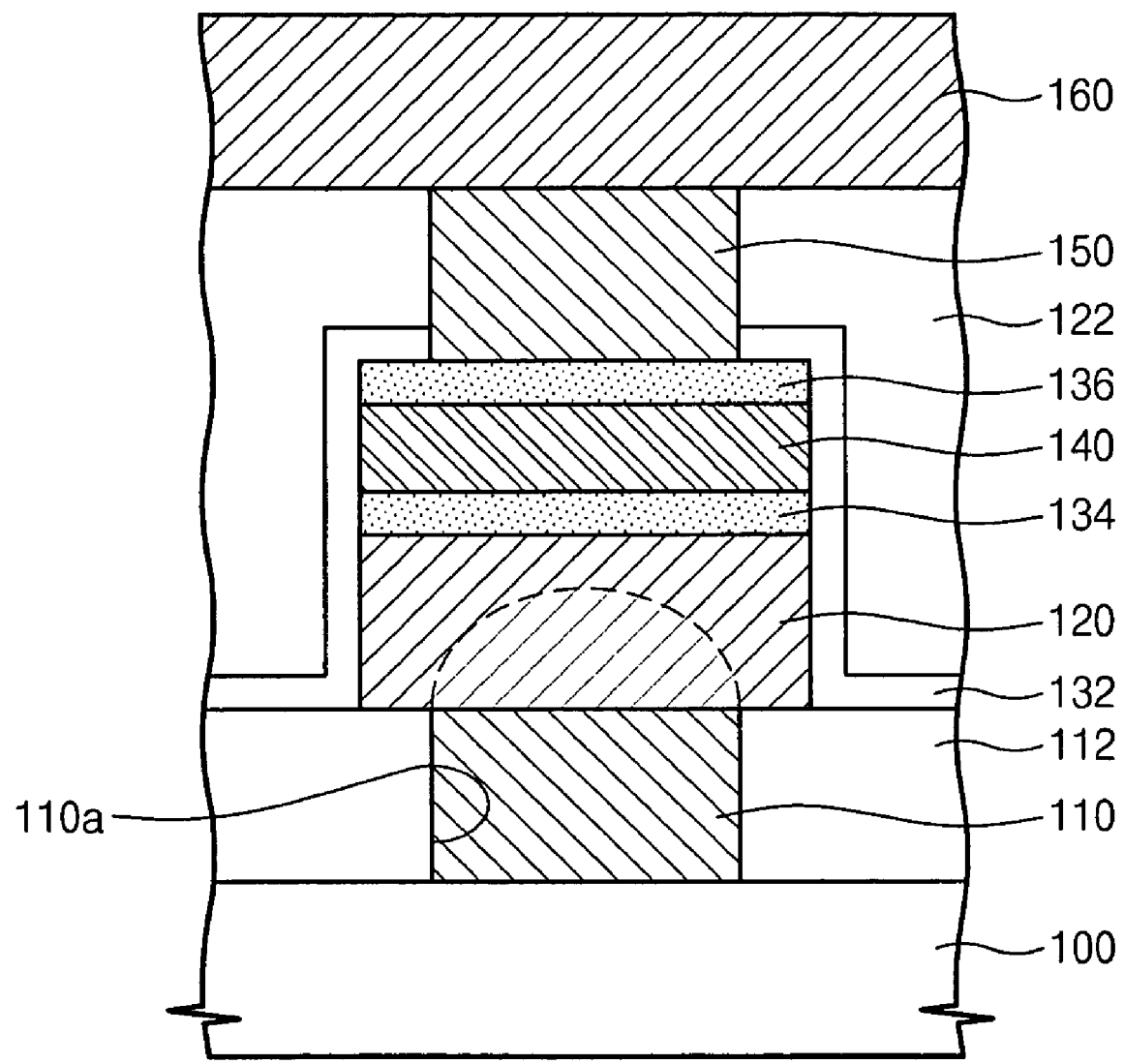
Figure 6:
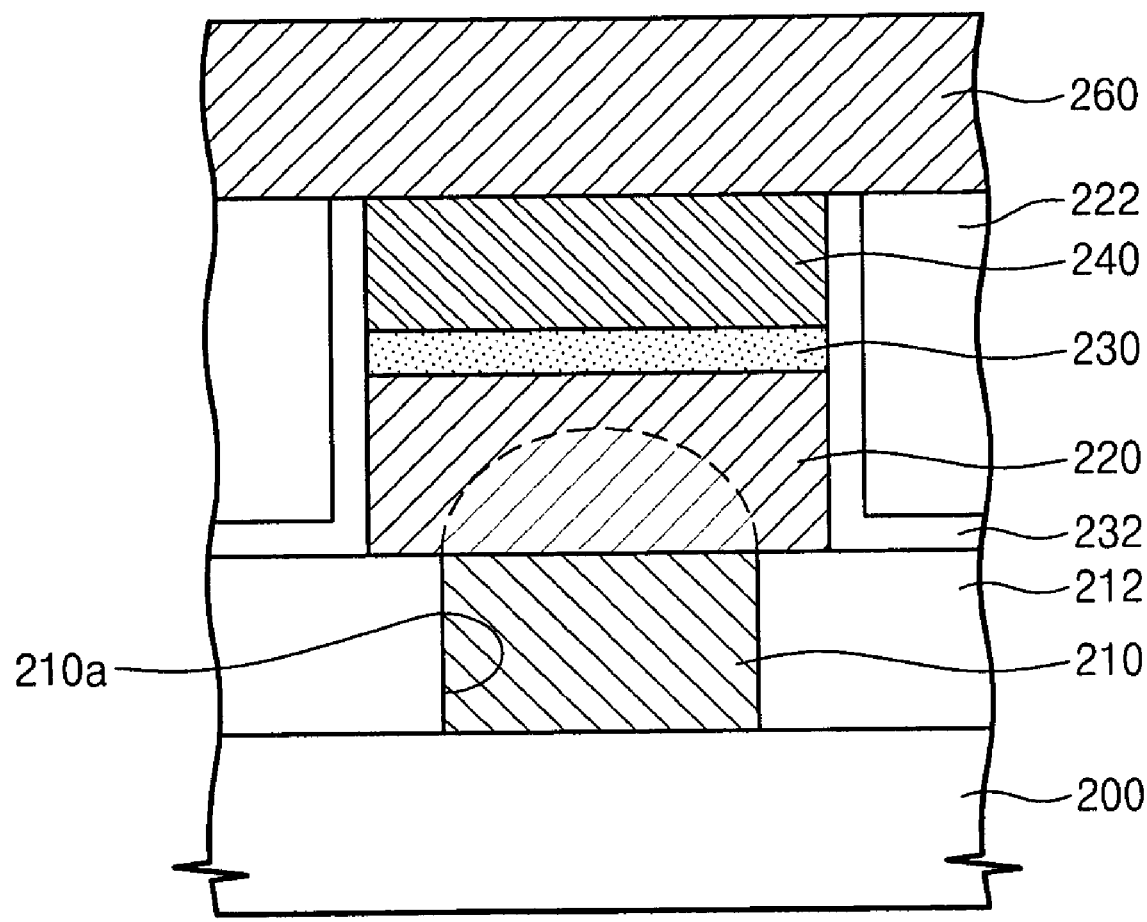

FIGS. 4 through 6 illustrate cross-sectional views of a nonvolatile memory device according to an embodiment. Referring to FIG. 4, a lower insulating layer 112 may be disposed on a semiconductor substrate 100 of a nonvolatile memory device. The lower insulating layer 112 may include, e.g., a silicon oxide layer. A phase change material pattern 120 and an upper electrode 140 may be sequentially stacked on the lower insulating layer 112. The phase change material pattern 120 and the upper electrode 140 may have an aligned sidewall. An adhesion pattern 130 may be disposed between the phase change material pattern 120 and the upper electrode 140. The adhesion pattern 130 may advantageously improve adhesion between the upper electrode 140 and the phase change material pattern 120, preventing a lifting problem from occurring.

A lower electrode 110 may be disposed in a first contact hole 110a that penetrates the lower insulating layer 112. The lower electrode 110 may be in contact with at least a portion of a bottom surface of the phase change material pattern 120. A bottom surface of the lower electrode 110 may be electrically connected to a source/drain of a transistor formed in the semiconductor substrate 100.

The lower electrode 110 may include a material in which resistivity increases in proportion to temperature, and may heat a region that is in contact with the phase change material pattern 120.

The upper electrode 140 may be connected to a bit line 160, through a bit line contact plug 150. An upper insulating layer 122 may be disposed between the lower insulating 112 and the bit line 160. A protection layer 132 may be disposed on sides of the phase change material pattern 120, the adhesion pattern 130, and the upper electrode 140. The protection layer 132 may cover a top surface of the upper electrode 140. The bit line contact plug 150 may penetrate the protection layer 132, so that the bit line contact plug 150 may be connected to the upper electrode 140. The protection layer 132 may include, e.g., a silicon nitride layer or a silicon oxynitride layer.

FIG. 5 illustrates a cross-sectional view of a nonvolatile memory device according to an embodiment. Referring to FIG. 5, a lower insulating layer 112 may be disposed on a semiconductor substrate 100 of a nonvolatile memory device. The lower insulating layer 112 may include, e.g., an oxide layer. A phase change material pattern 120, a lower adhesion pattern 134, an upper electrode 140, and an upper adhesion pattern 136 may be sequentially stacked on the lower insulating layer 112. The phase change material pattern 120, the lower adhesion pattern 134, the upper electrode 140, and the upper adhesion pattern 136 may have an aligned sidewall. The lower adhesion pattern 134 may beneficially improve adhesion between the upper electrode 140 and the phase change material pattern 120, preventing a lifting problem from occurring. The upper adhesion pattern 136 and the lower adhesion pattern 134 may include the same material.

A lower electrode 110 may be disposed in a first contact hole 110a that penetrates the lower insulating layer 112. The lower electrode 110 may be in contact with at least a portion of a bottom surface of the phase change material pattern 120. A bottom surface of the lower electrode 110 may be electrically connected to a source/drain of a transistor formed in the semiconductor substrate 100. The lower electrode 110 may include a material in which resistivity increases in proportion to temperature, and may heat a region which is in contact with the phase change material pattern 120.

The upper adhesion pattern 136 may be connected to a bit line 160, through a bit line contact plug 150. An upper insulating layer 122 may be disposed between the lower insulating 112 and the bit line 160. A protection layer 132 may be disposed on sides of the phase change material pattern 120, the lower adhesion pattern 134, the upper electrode 140, and the upper adhesion pattern 136. The protection layer 132 may cover a top surface of the upper adhesion pattern 136. The bit line contact plug 150 may penetrate the protection layer 132, so that the bit line contact plug 150 may be connected to the upper adhesion pattern 136. The protection layer 132 may include, e.g., a silicon nitride layer or a silicon oxynitride layer.

The lower adhesion pattern 134 may include a conductor including nitrogen. Specifically, the lower adhesion pattern 134 may include TiN$_y$ formed in the A2 region as shown in FIG. 2. The lower adhesion pattern 134 and the upper electrode 140 may include, e.g., a metal nitride layer or a metal oxynitride layer. A ratio of metal to nitrogen in the metal nitride layer or the metal oxynitride layer may be different in the lower adhesion pattern 134 and the upper electrode 140. The lower adhesion pattern 134 may include a metal nitride layer including metal and nitrogen, and a ratio of metal to nitrogen may be about 1:0.95 to about 1:1.03. The metal of the lower adhesion pattern may include at least one of titanium, tantalum, molybdenum, and tungsten. The upper adhesion pattern 136 may include the same material as the lower adhesion pattern 134.

FIG. 6 illustrates a cross-sectional view of a nonvolatile memory device according to an embodiment. Referring to FIG. 6, a lower insulating layer 212 may be disposed on a semiconductor substrate 200 of a nonvolatile memory device. The lower insulating layer 212 may include, e.g., an oxide layer. A phase change material pattern 220, an upper electrode 240, and an adhesion pattern 230 may be sequentially stacked on the lower insulating layer 212. The phase change material pattern 220, the upper electrode 240, and the adhesion pattern 230 may have an aligned sidewall. The adhesion pattern 230 may be disposed between the phase change material pattern 220 and the upper electrode 240. The lower adhesion pattern 230 may beneficially improve adhesion between the upper electrode 240 and the phase change material pattern 220, preventing a lifting problem from occurring. A lower electrode 210 may be disposed in a first contact hole 210a that penetrates the lower insulating layer 212. The lower electrode 210 may be in contact with at least a portion of a bottom surface of the phase change material pattern 220. A bottom surface of the lower electrode 210 may be electrically connected to a source/drain of a transistor formed in the semiconductor substrate 200. The lower electrode 210 may include a material in which resistivity increases in proportion to temperature, and may heat a region that is in contact with the phase change material pattern 220. The upper electrode 240 may be directly connected to a bit line 260. An upper insulating layer 222 may be disposed between the lower insulating layer 212 and the bit line 260. A protection layer 232 may be disposed on sides of the phase change material pattern 220, the adhesion pattern 230, and the upper electrode 240. The protection layer 232 may include, e.g., a silicon nitride layer.

Figure 7:
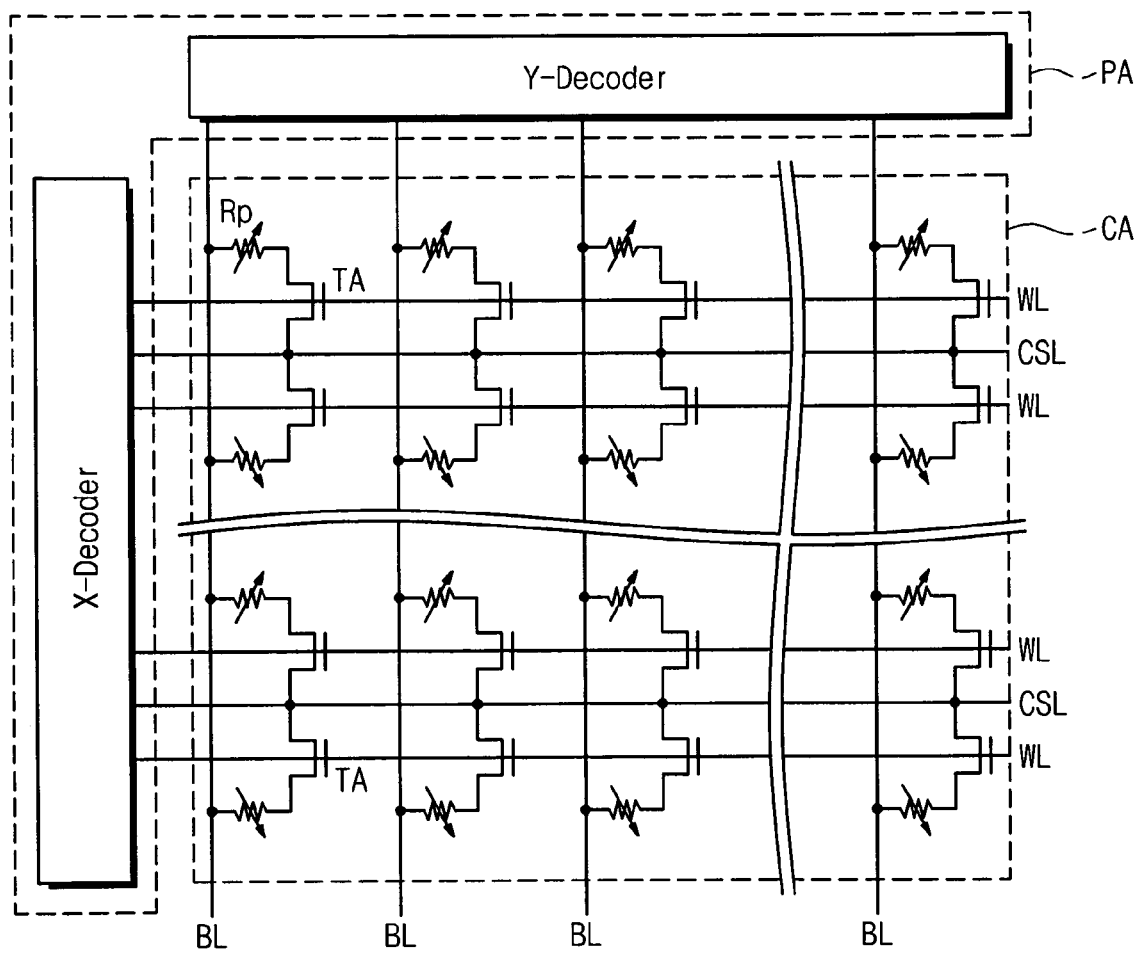
FIG. 7 illustrates a block diagram of a memory cell array including a nonvolatile memory device according to an embodiment.

FIG. 7 illustrates a block diagram of a memory cell array including a nonvolatile memory device according to an embodiment. Referring to FIG. 7, a nonvolatile memory device according to an embodiment may include a memory cell array region (CA) and a peripheral circuit region (PA). In the memory cell array region (CA), a plurality of word lines may extend in an x direction and a plurality of bit lines may extend in a y direction, crossing the x axis. A memory cell may be disposed at a region where a word line (WL) crosses a bit line (BL). An x-decoder and a y-decoder may be disposed at the peripheral circuit region (PA). The plurality of word lines may be connected to the x-decoder and the plurality of bit lines may be connected to the y-decoder. The x-decoder may select a specific word line (WL) and the y-decoder may select a specific bit line (BL). The memory cell may include a phase change resistor (Rp) and a switching device (TA) electrically connected to the phase change resistor (Rp). The switching device (TA) may include a MOS transistor.

The memory cell may include a lower electrode, a phase change material pattern, an adhesion layer, and an upper electrode. The lower electrode, which may apply heat to the phase change material pattern, may be disposed between the phase change material pattern and the switching device. The phase change resistor (Rp) may be electrically connected to the bit line. The switching device (TA) may include a gate electrode, a source, and a drain. The gate electrode may be connected to the word line and the drain may be connected to the phase change resistor (Rp). The source may be connected to a common source line (CSL).

Data may be stored in a selected memory cell by turning on a switching device (TA) of the selected memory cell, and forcing a recording current to the selected memory cell through a bit line (BL) connected to the selected memory cell. The recording current may include a reset current or a set current. The resistance state of the phase change material pattern of the selected memory cell may vary.

For reading operations, a switching device of the selected memory cell may be turned on and a reading voltage may be applied to a bit line connected to the selected memory cell. Data stored in the phase change material pattern may be decoded by detecting a current flowing in the phase change material pattern.

Figure 8:
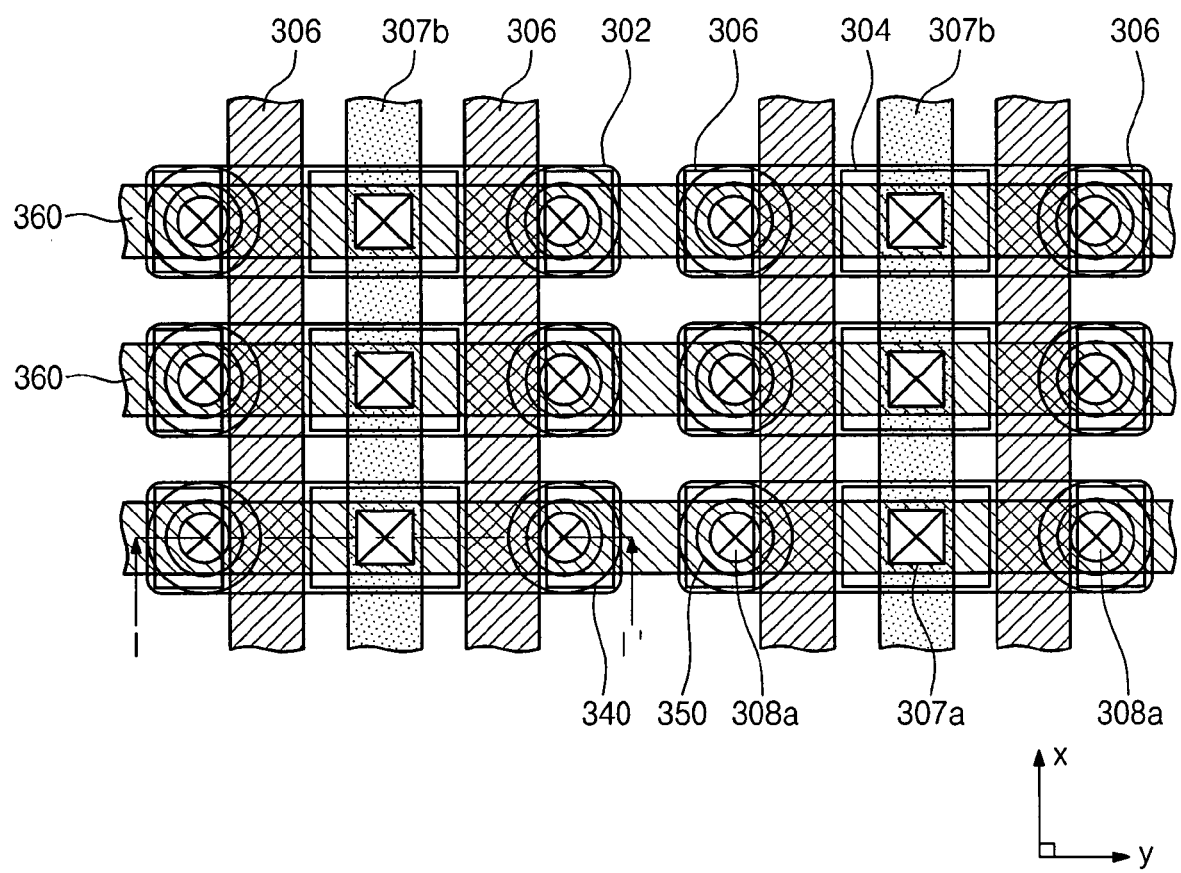
FIG. 8 illustrates a layout of a memory cell array including a nonvolatile memory device according to an embodiment.
Figure 9:
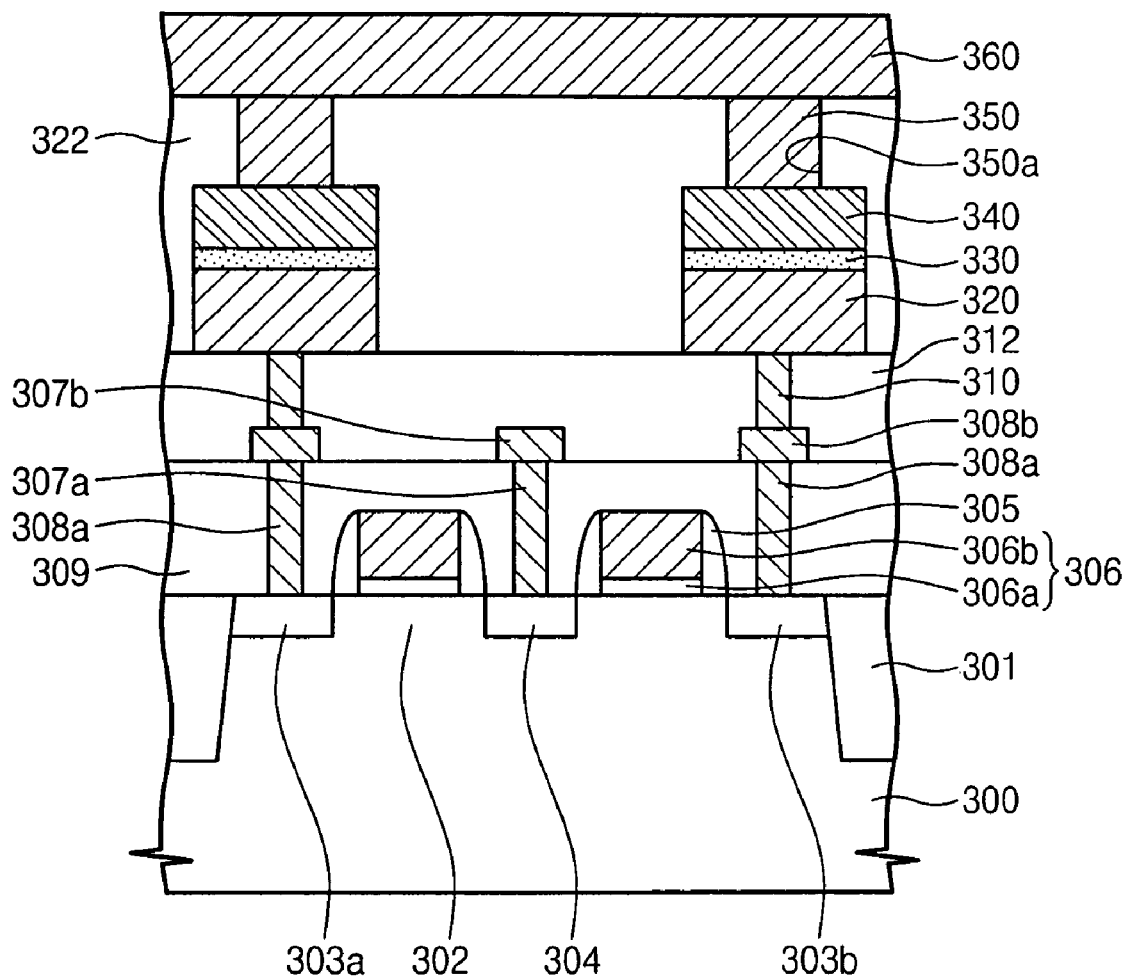
FIG. 9 illustrates a cross-sectional view along the line I-I' of FIG. 8.

FIG. 8 illustrates a layout of a memory cell array including a nonvolatile memory device according to an embodiment. FIG. 9 illustrates a cross-sectional view taken by the line I-I' of FIG. 8.

Referring to FIGS. 8 and 9, a device isolation layer 301 may be formed in a semiconductor substrate 300, to define an active region 302. The active region 302 may include a region where a switching device may be disposed. The active region 302 may have, e.g., an elliptical shape or a rectangular shape, when viewed from a top plan view. A major axis of the active region 302 may be disposed in parallel to a y axis. The active region 302 may be disposed to have a uniform distance in the x direction and in the y direction. The structure of the active region 302 may vary. Two word lines 306 may be disposed to cross one active region 302. A pair of switching devices may be disposed on one active region 302. The word line 306 may include a gate insulating layer 306a and a gate conductive pattern 306b, which are sequentially stacked on the semiconductor substrate 300. The gate insulating layer 306a may include, e.g., a silicon oxide layer. The gate conductive pattern 306b may include at least one of polysilicon, metal silicide, and metal. A spacer 305 may be disposed on a sidewall of the word line 306. An impurity region may be formed in the semiconductor substrate 300 at each side of the word line 306. The impurity region may form a source/drain of the switching device. A common source region 304 may be formed in the semiconductor substrate 300, between a pair of the word lines 306. A first drain region 303a and a second drain region 303b may be formed in the semiconductor substrate 300 at outer sides of a pair of the word lines 306, respectively.

A first insulating interlayer 309 may be formed on the semiconductor substrate 300 including the word line 306. The first insulating interlayer 309 may include, e.g., a silicon oxide layer. A first contact plug 308a may penetrate the first insulating interlayer 309, so that the first contact plug 308a may be connected to the first drain 303a and second drain 303b. The first contact plug 308a may include conductive material. A landing pad 308b may be formed on a top surface of the first contact plug 308a. A second contact plug 307a may penetrate the first insulating interlayer 309, so that the second contact plug 307a may be connected to the common source region 304. The first and second contact plugs 308a and 307a may include at least one of polysilicon, metal silicide, and metal. A common source line 307b (CSL) may be formed on the second contact plug 307a. The common source line 307b may extend in the same direction as the word line 306. The common source line 307b and the landing pad 308b may be concurrently formed. The common source line 307b and the landing pad 308b may each include at least one of polysilicon, metal silicide, and metal.

A lower insulating interlayer 312 may be formed on the common source line 307b and the landing pad 308b. A top surface of the lower insulating interlayer 312 may be planarized. A lower electrode 310 may penetrate the lower insulating interlayer 312, so that the lower electrode 310 may be connected to the landing pad 308b. A top surface of the lower electrode 310 may substantially coplanar with a top surface of the lower insulating interlayer 312.

A phase change material pattern 320, an adhesion pattern 330, and an upper electrode 340 may be sequentially stacked on the lower electrode 310. Side surfaces of the phase change material pattern 320, the adhesion pattern 330, and the upper electrode 340 may be aligned.

A bit line contact plug 350 may be disposed on the upper electrode 340. A bit line 360 may extend in the y direction on the bit line contact plug 350. An upper insulating interlayer 322 may be disposed between the bit line 360 and the lower insulating interlayer 312.

The adhesion pattern 330 and the upper electrode 340 may each independently include, e.g., a metal nitride layer or a metal oxynitride layer. However, a ratio of metal to nitrogen in the metal nitride layer or the metal oxynitride layer may be different in the adhesion pattern 330 and the upper electrode 340, respectively. Thus, the reset current of a PRAM according to an embodiment may be advantageously reduced by 50%, compared with a PRAM device not including the adhesion pattern 330 and upper electrode 340 of an embodiment. The adhesion pattern 330 may include a metal nitride layer. The ratio of metal to nitrogen may be about 1:0.95 to about 1:1.03. The metal of the adhesion pattern 330 may include at least one of titanium, tantalum, molybdenum, and tungsten.

Figure 10A:
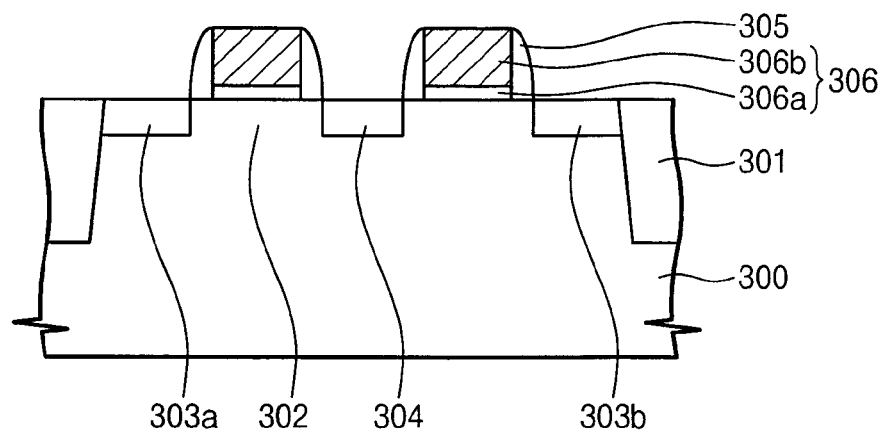
FIGS. 10A through 10D illustrate cross-sectional views of a method of forming a nonvolatile memory device according to an embodiment.

FIGS. 10A through 10D illustrate cross-sectional views of a method of forming a nonvolatile memory device according to an embodiment. Referring to FIG. 10A, a device isolation layer 301 may be formed in a semiconductor substrate 300, to define an active region 302. The device isolation layer 302 may be formed using, e.g., a shallow trench isolation process. A gate insulating layer 306a may be formed on the semiconductor substrate 300 including the device isolation layer 302. The gate insulating layer 306a may include, e.g., a silicon oxide layer. A gate conductive layer (not shown) may be formed on the gate insulating layer 306a. The gate insulating layer 306a may include at least one of polysilicon, metal silicide, and metal. A first hard mask may be formed on the gate conductive layer. A photoresist pattern (not shown) may be formed on the gate conductive layer. The gate conductive layer may be etched using the photoresist pattern as an etching mask to form a gate conductive pattern 306b. The gate insulating layer 306a disposed on both sides of the gate conductive pattern 306b may be removed by, e.g., a wet etching process.

A word line 306 may include the gate conductive pattern 306b and the gate insulating layer 306a. A spacer 305 may be formed on a sidewall of the word line 306 using, e.g., an anisotropic etching process. The spacer 305 may include, e.g., a silicon nitride layer. An ion implantation process may be performed on the semiconductor substrate 300 including the spacer 305, to form impurity regions in the semiconductor substrate 300 at each side of the word line 306. In the case of a NMOS, the impurity region may include an N-type, and in the case of a PMOS, the impurity region may include a P-type. A common source region 304 may be formed in the semiconductor substrate 300 between a pair of the word lines 306. A first drain region 303a and a second drain region 303b may be formed in the semiconductor substrate 300 at outer sides of a pair of the word lines 306, respectively.

Figure 10B:
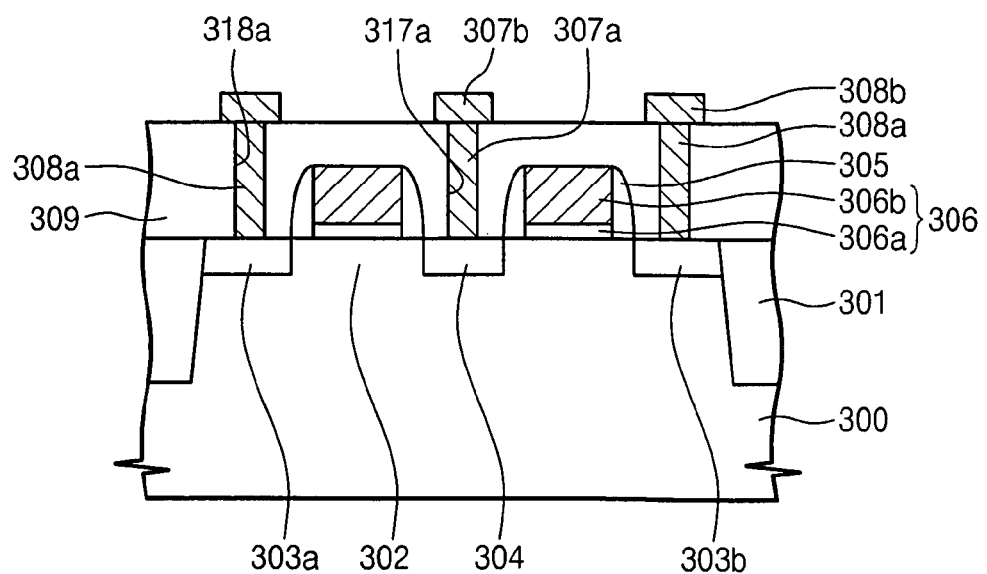

Referring to FIG. 10B, a first insulating interlayer 309 may be formed on the semiconductor substrate 300 including the impurity regions. The insulating interlayer may include, e.g., a silicon oxide layer. A top surface of the first insulating interlayer 309 may be planarized. A photoresist pattern may be formed on the first insulating interlayer 309. The first insulating interlayer 309 may be etched through to the impurity region, using the photoresist pattern as etching mask, to form a contact hole. The contact hole may include a first contact hole 318a formed on the first and second drain regions 303a and 303b, and a second contact hole 317a formed on the common source region 304. The first and second contact holes 318a and 317a may be filled with conductive material. A planarization process may be performed to form a first contact plug 308a and a second contact plug 307a. The planarization process may include, e.g., an etch-back process or a chemical mechanical polishing process. A top surface of the first contact plug 308a may be substantially coplanar with a top surface of the first insulating interlayer 309. A common source conductive layer may be formed on the first insulating interlayer 309, and a photoresist pattern may be formed on the common source conductive layer. The common source conductive layer may be etched, using the photoresist pattern as an etching mask, to form a landing pad 308b on the first contact plug 308a, and a common source line 307b on the second contact plug 307a. The common source line 307b may extend in the same direction as the word line. The common source conductive layer may include at least one of polysilicon, metal silicide, and metal.

Figure 10C:
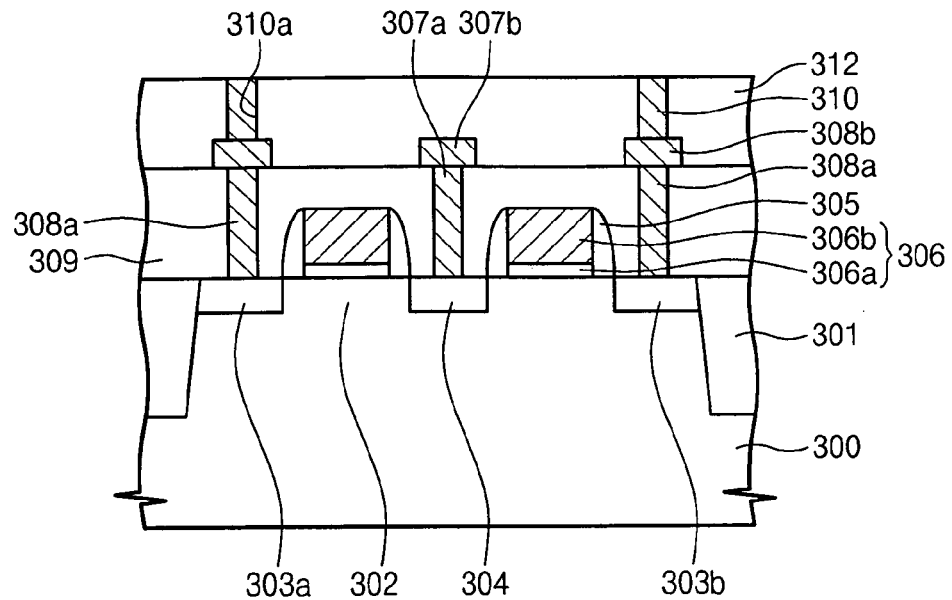

Referring to FIG. 10C, a lower insulating layer 312 may be formed on the semiconductor substrate 300 including the common source line 307b. The lower insulating layer 312 may include, e.g., a silicon oxide layer. A top surface of the lower insulating layer 312 may be planarized. A photoresist pattern may be formed on the lower insulating layer 312. The lower insulating layer 312 may be etched, using the photoresist pattern as an etching mask, to form a lower electrode contact hole 310a. The lower electrode contact hole 310a may expose at least a portion of the landing pad 308b.

A lower electrode layer (not shown) may be deposited on the semiconductor substrate 300 including the lower electrode contact hole 310a. A planarization process may be performed on the semiconductor substrate 300 including the lower electrode layer, to form a lower electrode 310 filling the lower electrode contact hole 310a.

Figure 10D:
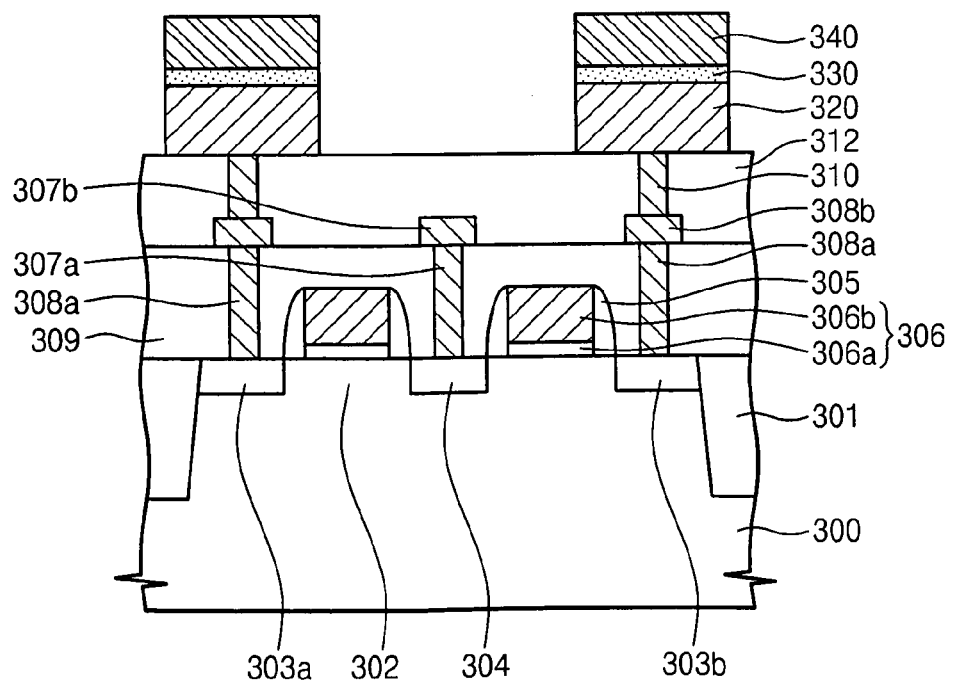

Referring to FIG. 10D, a phase change material layer (not shown), an adhesion layer (not shown), and an upper electrode layer (not shown) may be sequentially stacked on the semiconductor substrate 300 including the lower electrode 310. The upper electrode layer and the adhesion layer may be continuously formed using the same equipment, for simplicity and lower costs.

A photoresist pattern may be formed on the upper electrode layer. The phase change material layer, the adhesion layer, and the upper electrode layer may be continuously etched, using the photoresist pattern as an etching mask, to form an upper electrode 340, an adhesion pattern 330, and a phase change material pattern 320, respectively.

Referring to FIG. 9 again, an upper insulating layer 322 may be formed on the semiconductor substrate 300 including the upper electrode 340. A top surface of the upper insulating layer 322 may be planarized. A photoresist pattern may be formed on the upper insulating layer 322. The upper insulating layer 322 may be etched, using the photoresist pattern as an etching mask, to form a bit line contact hole 350a. The bit line contact hole 350a may expose at least a portion of the upper electrode 340. A bit line contact conductor may be conformally formed on the semiconductor substrate 300 including the bit line contact hole 350a. The bit line contact conductor may fill the bit line contact hole 350a. The semiconductor substrate 300 including the filled bit line contact hole 350a may be planarized to form a bit line contact plug 350. The bit line contact conductor may then fill only the bit line contact hole 350a. A bit line layer may be formed on the semiconductor substrate 300 including the bit line contact plug 350. A photoresist pattern may be formed on the bit line layer. The bit line layer may be patterned, using the photoresist pattern as a mask, to form a bit line 360. The bit line layer may include at least one of polysilicon, metal silicide, and metal.

Figure 11:
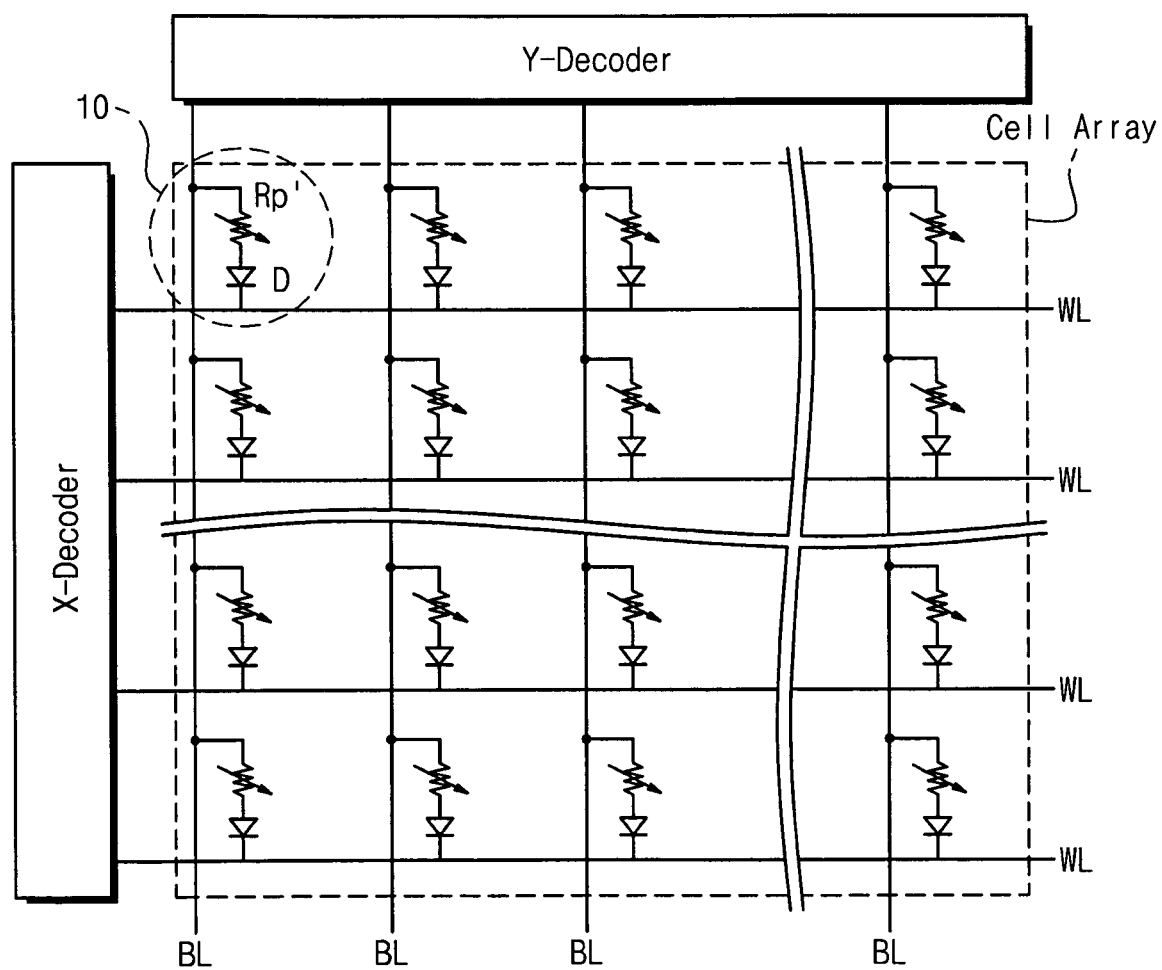
FIG. 11 illustrates a block diagram of a memory cell array including a nonvolatile memory device according to an embodiment.

FIG. 11 illustrates a block diagram of a memory cell array including a nonvolatile memory device according to an embodiment. A diode may be used as a switching device, instead of a MOS transistor. Referring to FIG. 11, the cell array may include a plurality of bit lines (BL), a plurality of word lines (WL) crossing the plurality of bit lines (BL), and a phase change memory cell disposed at an intersection between the bit line (BL) and the word line (WL).

The phase change memory cell 10 may include a phase change resistor (Rp') electrically connected to one of the bit lines (BL), and a cell diode electrically connected to the phase change resistor (Rp'). The phase change resistor (Rp') may include a sequentially stacked lower electrode, phase change material pattern, adhesion pattern, and upper electrode. The cell diode (D) may include, e.g., a P-type transistor and an N-type transistor. The lower electrode may be electrically connected to a P-type semiconductor of the cell diode, and the upper electrode may be electrically connected to one of the bit lines. Also, an N-type semiconductor of the cell diode of the cell diode may be electrically connected to one of the word lines (WL). The bit line (BL) may be connected to a Y-decoder, and the word line (WL) may be connected to an X-decoder. The Y-decoder may select any one of the bit lines and the X-decoder may select any one of the word lines.

Figure 12:
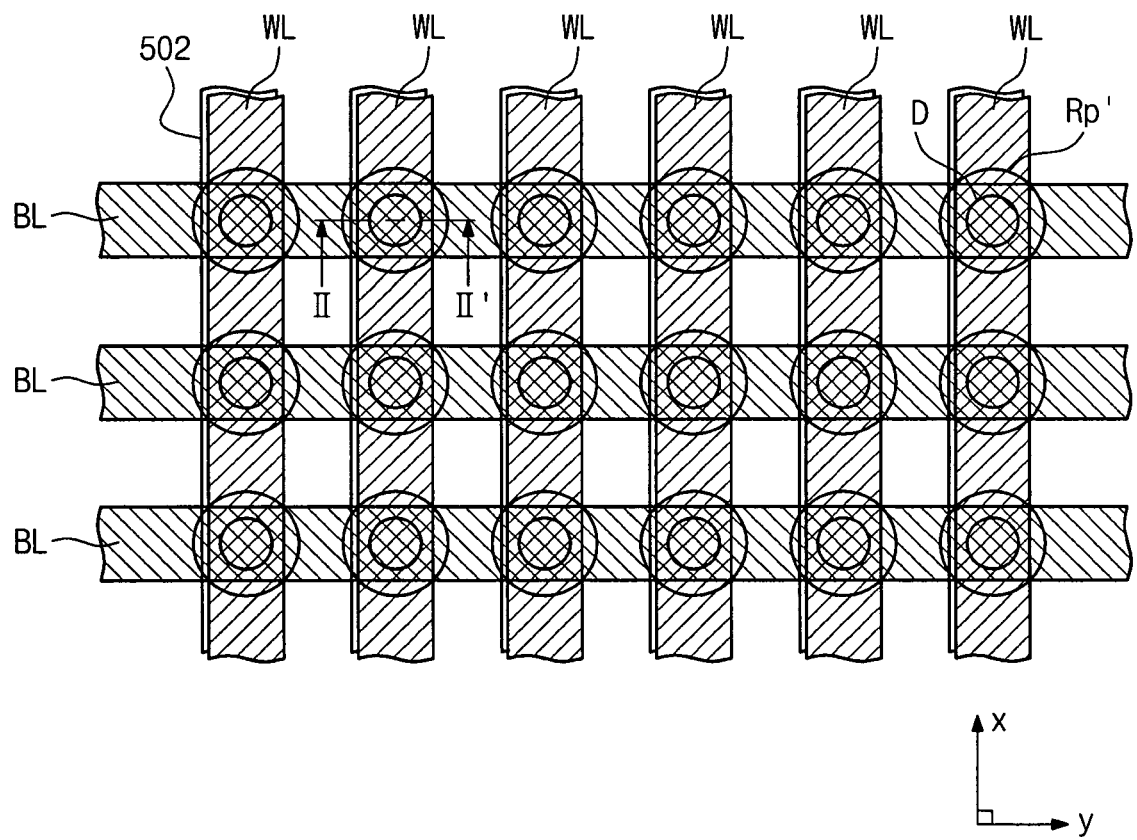
FIG. 12 illustrates a layout of a memory cell array including a nonvolatile memory device according to an embodiment.
Figure 13:
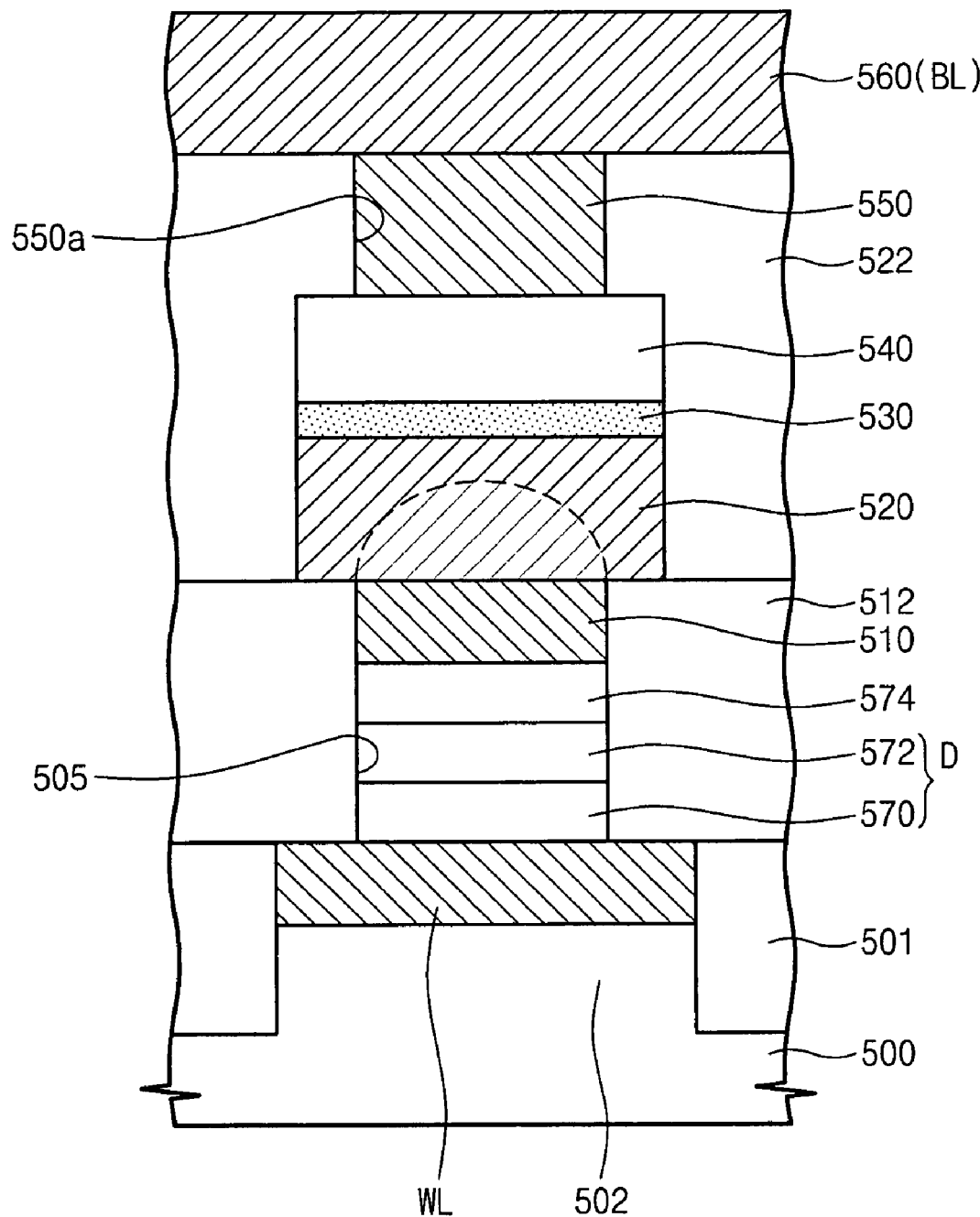
FIG. 13 illustrates a cross-sectional view of a nonvolatile memory device according to an embodiment.

FIG. 12 illustrates a layout of a memory cell array including a nonvolatile memory device according to an embodiment. FIG. 13 illustrates a cross-sectional view of a nonvolatile memory device according to an embodiment.

A device isolation layer 501 may be formed in a predetermined region of a semiconductor substrate 500 of a first conductivity type, to define an active region 502 having a line shape. An impurity of a type different from the first conductivity type may be diffused into the active region 502, and the active region 502 may act as a word line (WL). According to another embodiment, the word line (WL) may include, e.g., a conductive interconnection or an epitaxial semiconductor pattern, stacked on the semiconductor substrate 500.

A lower insulating interlayer 512 may be provided onto the word line (WL) and the device isolation layer 501. At least a portion of an upper surface of the word line (WL) may be exposed by a cell diode hole 505 that penetrates the lower insulating interlayer 512. A cell diode D may be provided into the cell diode hole 505. The cell diode D may include, e.g., an N-type semiconductor 570 and a P-type semiconductor 572. That is, the cell diode D may correspond to a vertical cell diode. A top surface of the cell diode D may be lower than a top surface of the lower insulating interlayer 512. A cell diode electrode 574 and a lower electrode 510 may be sequentially disposed on the cell diode D. A top surface of the lower electrode 510 may be substantially coplanar with a top surface of the lower insulating layer 512. The cell diode electrode 574 may include, e.g., metal silicide. The metal silicide may be formed by a silicide process.

A phase change material pattern 520, an adhesion pattern 530, and an upper electrode 540 may be disposed on the lower electrode 510. Side surfaces of the phase change material pattern 520, the adhesion pattern 530, and the upper electrode 540 may be aligned. A bit line contact plug 550 may be disposed on the upper electrode 540. A bit line 560 may be disposed on the bit line contact plug 550. An upper insulating interlayer 522 may be disposed between the bit line 560 and the lower insulating interlayer 512.

According to an embodiment, a cell diode D, a cell diode electrode 574, a lower electrode 510, and a phase change material pattern 520 may be disposed in the cell diode hole 505. The lower electrode 510 may be surrounded by a spacer (not shown) formed on the cell diode electrode 574. A top surface of the lower electrode 510 may be lower than a top surface of the lower insulating layer 512. The phase change material pattern 520 may have a "T" shape.

A method of forming a nonvolatile memory device according to an embodiment will be described. Referring to FIG. 13, a device isolation layer 501 may be formed in a predetermined region of a semiconductor substrate 500 having a first conductivity type, to define an active region 502 having a line shape. An impurity ion of a second conductivity type, different from the first conductivity type, may be diffused into the active region 502, to form a word line (WL) of the second conductivity type. The first conductivity type may be a P-type and the second conductivity type may be an N-type.

A lower insulating interlayer 512 may be formed on the semiconductor substrate 500 including the word line (WL). The lower insulating interlayer 512 may be patterned to form a cell diode hole 505, which exposes at least a portion of a top surface of the word line (WL). An N-type semiconductor 570 and a P-type semiconductor 572 may be sequentially formed in the cell diode hole 505. The N-type semiconductor 570 and the P-type semiconductor 572 may be formed, e.g., using the word line (WL) as a seed by, e.g., a selective epitaxial growth (SEG). The N-type semiconductor 570 and the P-type semiconductor 572 may be, e.g., in-situ doped.

According to an embodiment, a top surface of the P-type semiconductor 572, formed by, e.g., selective epitaxial growth (SEG), may be higher than a top surface of the lower insulating interlayer 512. Thus, the P-type semiconductor 572 and the lower insulating interlayer 512 may be planarized. A top surface of the planarized P-type semiconductor 572 may be selectively recessed.

The N-type semiconductor 570 and the P-type semiconductor 572 may constitute a cell diode D. A cell diode electrode 574 may be selectively formed on the P-type semiconductor 572. The cell diode electrode 574 may include, e.g., metal silicide. The metal silicide may be formed by, e.g., a silicide process. A top surface of the cell diode electrode 574 may be lower than a top surface of the lower insulating interlayer 512. A lower electrode 510 may be formed on the cell diode electrode 574. A top surface of the lower electrode 510 may be substantially coplanar with the lower insulating interlayer 512. That is, a conductive layer may be conformally formed to fill the cell diode hole 505, and the conductive layer may then be planarized to form the lower electrode 510. The planarization may be performed by, e.g., an etch-back process or a chemical mechanical polishing process.

A phase change material layer, an adhesion layer, and an upper electrode layer may be formed on the semiconductor substrate 500 including the lower electrode 510. The phase change material layer, the adhesion layer, and the upper electrode layer may be sequentially patterned to form an upper electrode 540, an adhesion pattern 530, and a phase change material pattern 520, respectively. The lower electrode 510, the phase change material pattern 520, the adhesion pattern 530, and the upper electrode 540 may constitute a phase change resistor (RP').

An upper insulating interlayer 522 may be formed on the semiconductor substrate 500 including the upper electrode 540. The upper insulating interlayer 522 may be patterned to form a bit line contact hole 550a. The bit line contact hole 550a may expose at least a portion of a surface of the upper electrode 540. A conductive material may be deposited to fill the bit line contact hole 550a, and the conductive material may then be patterned to form a bit line contact plug 550.

According to an embodiment, the bit line contact plug 550 and a bit line 560 may be substantially simultaneously formed. Specifically, the bit line contact plug 550 and the bit line 560 may be substantially simultaneously formed by forming a conductive material in the bit line contact hole 550a, and patterning the conductive material.

Figure 14:
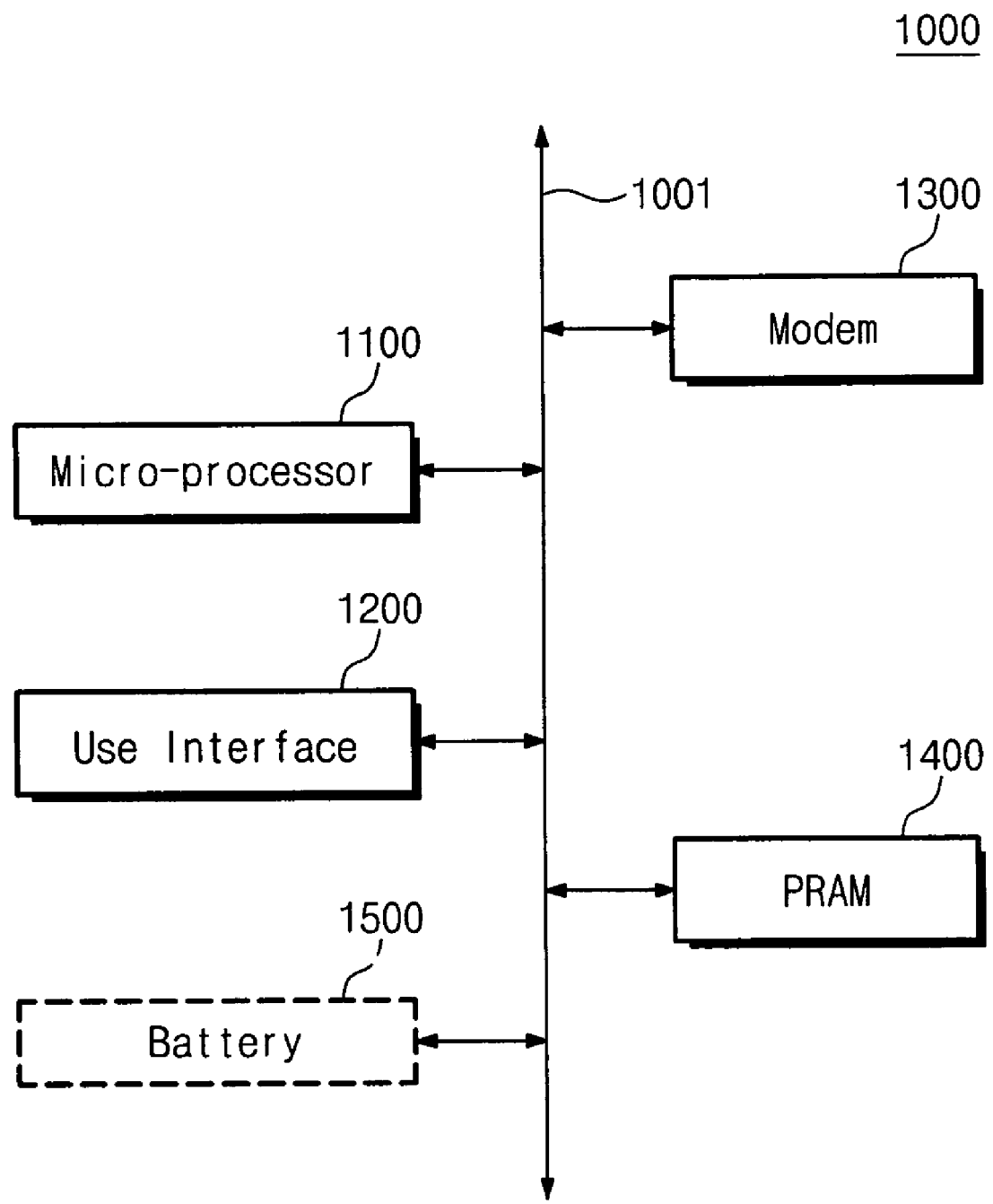
FIG. 14 illustrates a block diagram of a system according to an embodiment.

FIG. 14 illustrates a block diagram of a system according to an embodiment. Referring to FIG. 14, a system 1000, e.g., a computer system and/or a mobile device, may include a microprocessor 1100 electrically connected to a bus 1001, a user interface 1200, a modem 1300, e.g., a base band chipset, and a phase change memory device 1400. The phase change memory device 1400 may include the phase change memory device as described above. The phase change memory device 1400 may store data treated by the microprocessor 1100. If the system according to an embodiment includes a mobile device, a battery 1500 for supplying a system operation voltage may also be provided. An applied chipset, a camera image processor, a mobile DRAM, and a NAND flash device, or the like, may also be provided to the system 1000.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a nonvolatile memory device, comprising:
   forming a lower electrode on a semiconductor substrate;
   forming a phase change material pattern on the lower electrode;
   forming an adhesion pattern on the phase change material pattern; and
   forming an upper electrode on the adhesion pattern, wherein the adhesion pattern includes a conductor including nitrogen, and the adhesion pattern is formed in a sputtering device using argon and nitrogen plasma on a metal target.

2. The method of manufacturing a nonvolatile memory device as claimed in claim 1, wherein:

the adhesion pattern and the upper electrode each independently include a metal nitride layer or a metal oxynitride layer, and a ratio of metal to nitrogen in the metal nitride or oxynitride layer in the adhesion pattern is different from a ratio of metal to nitrogen in the metal nitride or oxynitride layer in the upper electrode.

3. The method of manufacturing a nonvolatile memory device as claimed in claim 1, wherein:

the adhesion pattern and the upper electrode are formed in the sputtering device using argon and nitrogen plasma on the metal target, and the adhesion pattern includes a metal nitride layer formed under a partial pressure of nitrogen that results in a total pressure in the sputtering device, measured as the partial pressure of nitrogen increases, being different than a total pressure in the sputtering device under the same partial pressure of nitrogen, measured as the partial pressure of nitrogen decreases.

4. The method of manufacturing a nonvolatile memory device as claimed in claim 1, wherein the adhesion pattern includes a metal nitride layer, and a ratio of metal to nitrogen in the metal nitride layer is about 1:0.95 to about 1:1.03.

5. The method of manufacturing a nonvolatile memory device as claimed in claim 4, wherein the metal of the metal nitride layer includes at least one of titanium, tantalum, molybdenum, and tungsten.

6. The method of manufacturing a nonvolatile memory device as claimed in claim 1, wherein the upper electrode includes at least one of metal, metal nitride, and metal oxynitride.

7. The method of manufacturing a nonvolatile memory device as claimed in claim 6, wherein the upper electrode includes a metal including at least one of Ti, Ta, Mo, W, TiW, TiSi, and TaSi.

8. The method of manufacturing a nonvolatile memory device as claimed in claim 6, wherein the upper electrode includes a metal nitride including at least one of TiN, TaN, WN, MoN, NbN, TiSiN, TiAlN, ZrSiN, WSiN, WBN, ZrAlN, MoSiN, TaSiN, and TaAlN.

9. The method of manufacturing a nonvolatile memory device as claimed in claim 6, wherein the upper electrode includes a metal oxynitride including at least one of TiON, TiAlON, WON, and TaON.

10. The method of manufacturing a nonvolatile memory device as claimed in claim 1, wherein the phase change material pattern includes at least one of Ge—Sb—Te, Sb—Te, As—Sb—Te, and Sb—Se.

11. The method of manufacturing a nonvolatile memory device as claimed in claim 10, wherein the phase change material pattern further includes at least one metal layer.

12. The method of manufacturing a nonvolatile memory device as claimed in claim 1, wherein the lower electrode includes at least one of metal nitride, metal, metal oxynitride, silicide, and conductive carbon.

13. The method of manufacturing a nonvolatile memory device as claimed in claim 1, wherein forming the adhesion pattern on the phase change material pattern and forming the upper electrode on the adhesion pattern are continuously performed using the same equipment.

* * * * *